United States Patent
Okumura et al.

(10) Patent No.: US 9,310,394 B2
(45) Date of Patent: Apr. 12, 2016

(54) CURRENT SENSOR AND MANUFACTURING METHOD FOR THE SAME

(71) Applicant: AISIN SEIKI KABUSHIKI KAISHA, Kariya-shi, Aichi-ken (JP)

(72) Inventors: Ken Okumura, Hekinan (JP); Shigeki Niimi, Kariya (JP); Kenichi Taguchi, Toyota (JP); Akira Kamiya, Nagoya (JP); Takashi Kurozumi, Kariya (JP); Kimihiro Tamura, Nagoya (JP); Katsuki Kataoka, Kariya (JP)

(73) Assignee: AISIN SEIKI KABUSHIKI KAISHA, Kariya-shi, Aichi-ken (JP)

( * ) Notice: Subject to any disclaimer, the term of this patent is extended or adjusted under 35 U.S.C. 154(b) by 6 days.

(21) Appl. No.: 14/099,327

(22) Filed: Dec. 6, 2013

(65) Prior Publication Data

US 2014/0176124 A1    Jun. 26, 2014

(30) Foreign Application Priority Data

Dec. 20, 2012  (JP) .................................. 2012-278561
Jun. 24, 2013  (JP) .................................. 2013-131776

(51) Int. Cl.
```
G01R 19/00      (2006.01)
G01R 1/04       (2006.01)
G01R 3/00       (2006.01)
G01R 15/20      (2006.01)
```

(52) U.S. Cl.
CPC .. *G01R 1/04* (2013.01); *G01R 3/00* (2013.01); *G01R 15/20* (2013.01); *Y10T 29/49149* (2015.01)

(58) Field of Classification Search
CPC .. G01R 19/00; G01R 33/0011; G01R 15/202; G01R 33/07
USPC ............ 324/207.2, 76.11, 117 H, 127, 151 A
See application file for complete search history.

(56) References Cited

U.S. PATENT DOCUMENTS 3,845,445 A * 10/1974 Braun et al. ................. 338/32 H
4,059,798 A * 11/1977 Dierker et al. ................ 324/127
4,994,739 A *  2/1991 Honda et al. ............. 324/207.14
5,694,103 A * 12/1997 Goodwin et al. ............. 336/178

(Continued)

FOREIGN PATENT DOCUMENTS

JP    2002-303642 A    10/2002
JP    2009-121864 A     6/2009

OTHER PUBLICATIONS

Communication dated Nov. 27, 2015, issued by the European Patent Office in corresponding European Application No. 13195987.6.

*Primary Examiner* — Patrick Assouad
*Assistant Examiner* — Demetrius Pretlow
(74) *Attorney, Agent, or Firm* — Sughrue Mion, PLLC (57) ABSTRACT

A current sensor includes: a housing that holds a busbar to which a current is applied and a core arranged around the busbar; a circuit board fixed to the housing in the state of being arranged to face the housing; and a detection element for detecting the current; wherein the detection element has an element main body held in the housing and plural connection terminals fixed in through-holes in the circuit board, and a plate-like member provided with guide holes in which the connection terminals are inserted and which have a diameter reduced from the side of the housing toward the side of the circuit board is provided on a surface facing the housing, of two surfaces of the circuit board.

7 Claims, 8 Drawing Sheets

(56) References Cited

U.S. PATENT DOCUMENTS

| | | | |
|---|---|---|---|
| 6,404,180 B1* | 6/2002 | Haensgen | 324/117 H |
| 6,426,617 B1* | 7/2002 | Haensgen et al. | 324/117 H |
| 6,500,018 B1* | 12/2002 | Pfaffenberger et al. | 439/325 |
| 6,545,456 B1* | 4/2003 | Radosevich et al. | 324/117 H |
| 6,759,840 B2* | 7/2004 | Marasch et al. | 324/117 H |
| 7,002,440 B2* | 2/2006 | Attarian et al. | 335/18 |
| 7,193,408 B2* | 3/2007 | Cattaneo et al. | 324/117 R |
| 2001/0032388 A1* | 10/2001 | Morris | 29/852 |
| 2003/0227284 A1* | 12/2003 | Marasch et al. | 324/117 H |
| 2003/0227285 A1* | 12/2003 | Marasch et al. | 324/117 R |
| 2005/0237050 A1* | 10/2005 | Itoh | 324/117 R |
| 2006/0043960 A1* | 3/2006 | Itoh et al. | 324/117 R |
| 2010/0259248 A1* | 10/2010 | Labbe | 324/151 R |
| 2011/0068771 A1 | 3/2011 | Ueno et al. | |
| 2012/0217964 A1 | 8/2012 | Iizuka et al. | |

\* cited by examiner

CURRENT SENSOR AND MANUFACTURING METHOD FOR THE SAME

CROSS REFERENCE TO RELATED APPLICATIONS

This application is based on and claims priority under 35 U.S.C. §119 to Japanese Patent Applications 2012-278561 and 2013-131776, filed on Dec. 20, 2012 and Jun. 24, 2013, respectively, the entire content of which is incorporated herein by reference.

TECHNICAL FIELD

This disclosure relates to a current sensor including: a housing that holds a busbar to which a current is applied and a core arranged around the busbar; a circuit board fixed to the housing in the state of being arranged to face the housing; and a detection element for detecting the current; wherein the detection element has an element main body held in the housing and plural connection terminals fixed in through-holes in the circuit board, and a manufacturing method for the same.

BACKGROUND DISCUSSION

Recently, hybrid vehicles and electric vehicles using a motor and an inverter are widely used. In order to control the rotation of the motor properly in such fields, it is important to measure a current flowing through the motor.

As a method of measuring such a current, for example, there is a current sensor in which, according to a current applied to a busbar that connects the motor and the inverter, a magnetic field generated around the busbar is detected by a detection element (magnetic sensor) and the current applied to the busbar is calculated based on the detected magnetic field, for example, as disclosed in JP 2009-121864A (Reference 1).

In the current sensor disclosed in Reference 1, the busbar to which the current is applied and a core that concentrates the magnetic field are held in the housing, with the core arranged around the busbar. A predetermined gap is formed in the core, and an element main body of the detection element is arranged in the gap.

The detection element, after having plural connection terminals fixed to a circuit board by soldering or the like, is assembled on both the circuit board and the housing so that the element main body is arranged in the gap.

In the related-art current sensor, the detection element is assembled on both the circuit board and the housing by holding the element main body in the housing after the plural connection terminals are fixed to the circuit board.

Therefore, at the stage where the plural connection terminals are fixed to the circuit board, the attitude of the element main body to the circuit board is restricted. Meanwhile, the circuit board is fixed to the housing, in a predetermined attitude facing the housing.

Therefore, when the element main body is assembled in such a way that the element main body is held in the housing, if there is an error in the attitude of the element main body to the circuit board, an operation to correct the attitude or the like is necessary and it takes time and effort to assemble the detection element on both the circuit board and the housing.

If the assembling accuracy is roughly set by expanding the gap between the core and the element main body in order to facilitate the assembling of the detection element, detection accuracy may fall.

Also, if the assembling accuracy of the element main body to the core is set roughly, the change in the attitude of the element main body to the core caused by temperature change increases because of the difference in the coefficient of thermal expansion between the circuit board and the housing. Detection accuracy may fall for this reason as well.

SUMMARY

Thus, a need exists for a current sensor which is not suspectable to the drawback mentioned above.

An aspect of this disclosure is directed to a current sensor including: a housing that holds a busbar to which a current is applied and a core arranged around the busbar; a circuit board fixed to the housing in the state of being arranged to face the housing; and a detection element for detecting the current; wherein the detection element has an element main body held in the housing and plural connection terminals fixed in through-holes in the circuit board, and wherein a plate-like member provided with guide holes in which the connection terminals are inserted and which have a diameter reduced from the side of the housing toward the side of the circuit board is provided on a surface facing the housing, of two surfaces of the circuit board.

In the current sensor with this configuration, the plate-like member provided with the guide holes in which the connection terminals are inserted and which have a diameter reduced from the side of the housing toward the side of the circuit board is provided on the surface facing the housing, of the two surfaces of the circuit board.

Therefore, after the element main body is assembled at a predetermined position in the housing, each of the plural connection terminals can be inserted into each guide hole provided in the plate-like member, thus guiding the connection terminals to enter the through-holes in the circuit board.

Thus, the detection element can be easily assembled on both the circuit board and the housing, with each of the plural connection terminals securely entering each through-hole in the circuit board, while high assembling accuracy of the element main body to the core can be set in order to achieve high detection accuracy.

Moreover, as high assembling accuracy of the element main body to the core is set, the change in the attitude of the element main body to the core due to the difference in the coefficient of thermal expansion between the circuit board and the housing can be restrained.

Thus, according to the current sensor with this configuration, detection accuracy can be improved while the assembling of the detection element on both the circuit board and the housing is facilitated.

Another aspect of this disclosure is directed to a method for manufacturing a current sensor including the steps of: causing a holding portion provided in a housing that holds a busbar to which a current is applied and a core arranged around the busbar, to hold element main bodies of plural detection elements for detecting the current in the state where that plural connection terminals extending from the element main bodies are bent so that adjacent connection terminals are spaced away from each other, and where an end of each connection terminal is bent to align an extending direction of the end with a direction toward a circuit board from the housing; mounting a plate-like member onto a surface facing the housing, of two surfaces of the circuit board fixed to the housing in the state of facing the housing, the plate-like member being provided with plural guide holes that have a diameter reduced from the side of the housing toward the side of the circuit board; situating the circuit board and the plate-like member closely to the housing holding the plural element main bodies, then inserting each of the ends of the connection terminals into the corresponding guide hole in the plate-like member and a corresponding through-hole in the circuit board while aligning the housing with the circuit board, and fixing the circuit board to the housing; and soldering the end of each of the connection terminals to the circuit board.

That is, as each holding portion provided in the housing that holds the busbar and the core holds the element main bodies of the plural detection elements, each element main body can be assembled to the core accurately.

As the circuit board and the plate-like member mounted on the surface of the circuit board facing the housing are situated closely to the housing, each of the ends of the connection terminals aligned in the direction toward the circuit board from the housing is inserted in the corresponding guide hole and the through-hole in the circuit board, while the housing and the circuit board are aligned together. Thus, the circuit board is fixed to the housing.

The respective connection terminals of the detection elements are bent in such a way that adjacent connection terminals are spaced away from each other, and the end of each connection terminal is bent toward the circuit board.

Therefore, even if large guide holes in which the connection terminals can be easily introduced are provided as guide holes in the plate-like member, these guide holes can be arranged without interfering with each other. Also, if the circuit board thermally expands and becomes displaced with respect to the housing, the connection terminals become deformed by bending and thus can absorb the displacement.

Also, the bending direction of the connection terminals is not the same direction but is set in directions away from each other. Therefore, when the circuit board is displaced in a particular direction with respect to the housing, even if a direction of the external force acting on each connection terminal is the same, the connection terminals bend in different directions from each other and therefore the connection terminals have different bending states from each other. Thus, no matter which direction the circuit board is displaced in, the influence of the external force applied to the element main bodies is averaged and the mounting stability of the element main bodies is increased.

Moreover, while each of the ends of the plural connection terminals can be easily inserted in the through-hole in the circuit board, the circuit board can be fixed to the housing in the state where the movement with respect to the circuit board, of the connection terminals with the ends thereof inserted in the through-holes is allowed.

As each of the ends of the connection terminals inserted in the through-hole in the circuit board is soldered to the circuit board after the circuit board is fixed to the housing, the detection element can be assembled on both the circuit board and the housing.

Thus, each connection terminal can be soldered to the circuit board in the state where there is little residual stress, and the assembling attitude of each element main body to the core can be easily stabilized.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, embodiments disclosed here will be described.

First Embodiment

Figure 1:
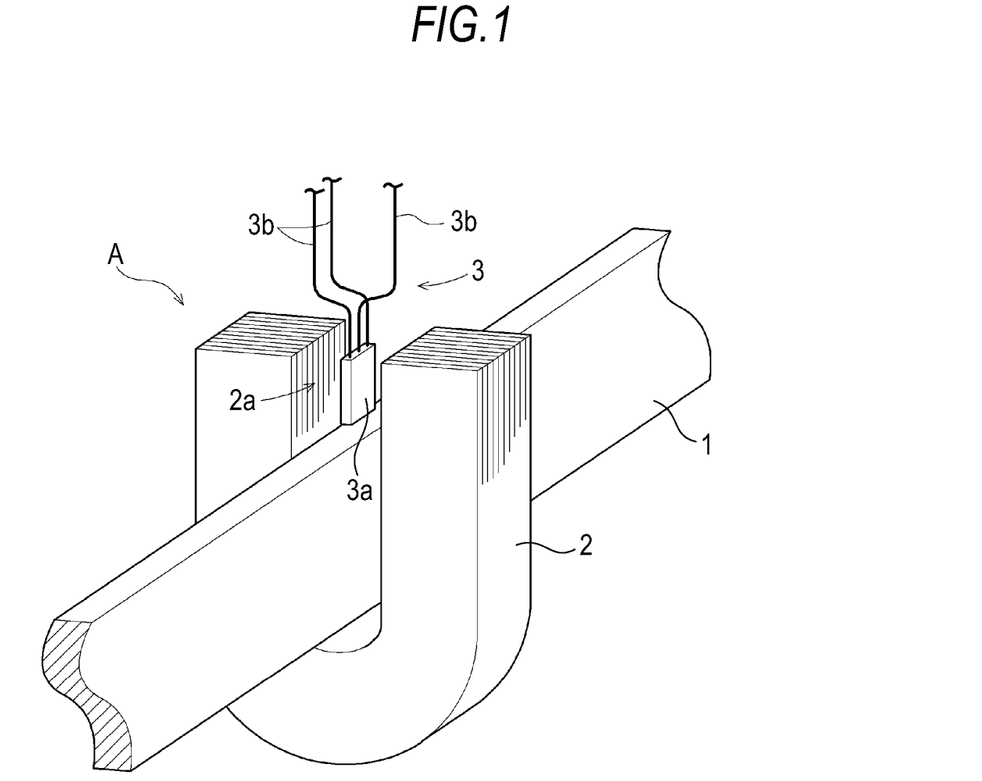
FIG. 1 is a perspective view schematically showing a current sensor.
Figure 2:
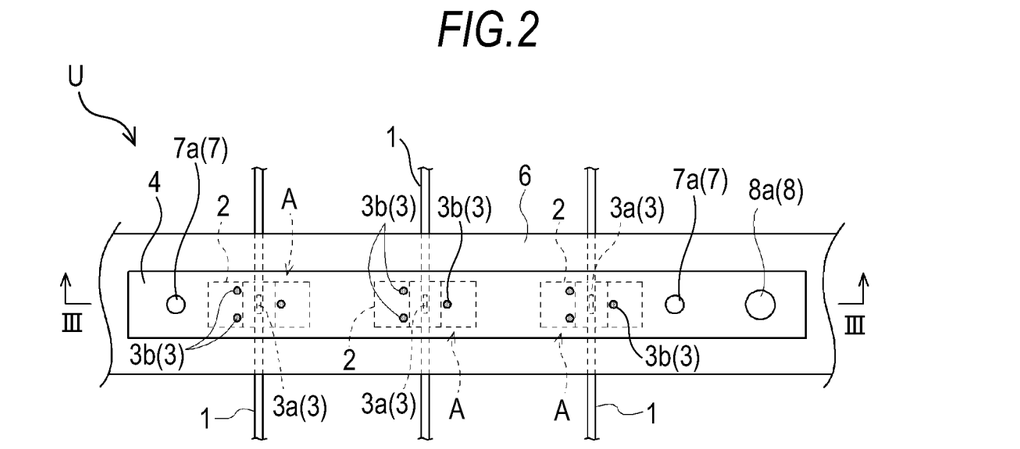
FIG. 2 is a plan view of a sensor unit having plural current sensors.
Figure 3:
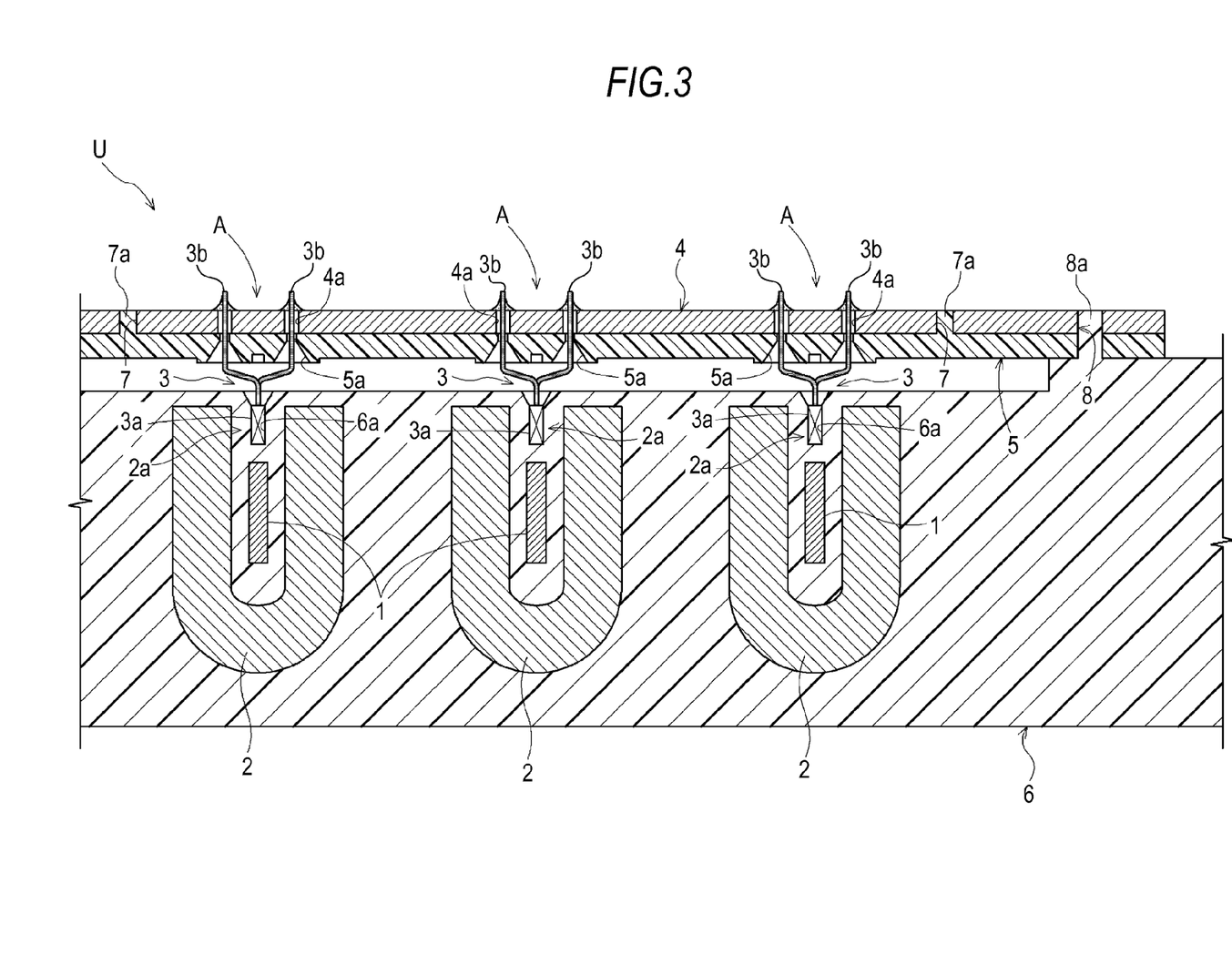
FIG. 3 is a cross-sectional view taken along III-III in FIG. 2.
Figure 4:
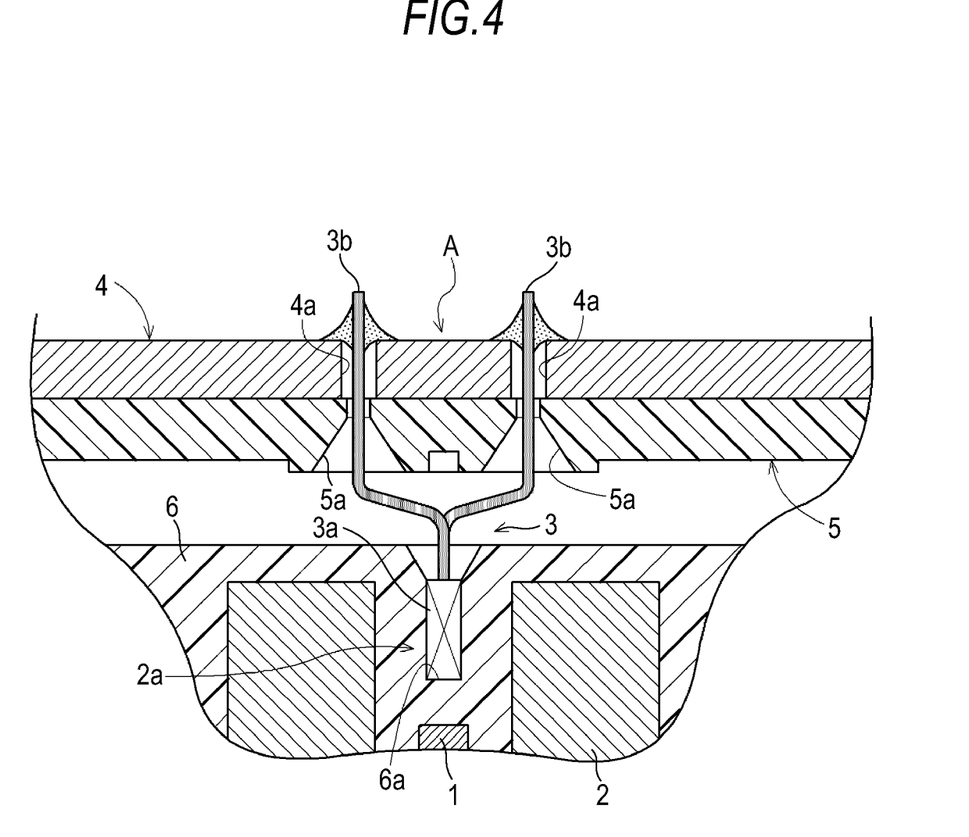
FIG. 4 is an enlarged cross-sectional view of the current sensor.

FIG. 1 schematically shows a current sensor A according to an embodiment disclosed here. FIGS. 2 and 3 show a sensor unit U including plural current sensors A as a unit. FIG. 4 shows an enlarged cross-sectional view of the current sensor A provided in the sensor unit U.

As shown in FIG. 1, the current sensor A detects the magnetic flux density of a magnetic field generated by a current to be measured flowing through a busbar 1 in order to measure the current to be measured applied to the busbar 1, and measures the current (current value) flowing through the busbar 1, based on the detected magnetic flux density.

As shown in FIGS. 2 to 4, the current sensor A has the busbar 1 in the shape of a strip-like plate made of a conductor, a core 2 made of a metal magnetic body, a Hall IC 3 as a detection element for detecting a current, a printed board (circuit board) 4 formed with a resin material, a terminal guide plate 5 made of a resin material as a plate-like member provided with guide holes 5a, and a housing 6 made of a resin material, and the like.

The busbar 1 is used to connect a three-phase motor, not shown, to an inverter that electrifies the three-phase motor. The three-phase motor is used as a driving source of a hybrid vehicle, electric vehicle or the like, and has three busbars 1 for each combination of three-phase motor and inverter.

The sensor unit U is formed as a unit in which three current sensors A corresponding to the three busbars 1, respectively, are arrayed in a line, as shown in FIG. 2. If the current to be measured increases, additional current sensor(s) A may be added to the unit.

The core 2 is formed in a U-shape by plural magnetic steel plates stacked together and having a gap 2a between two ends. The core 2 surrounds the outer peripheral side of the busbar 1 in the circumferential direction and concentrates magnetism. The busbar 1 is inserted with a space on the inner peripheral side of the core 2 in such a way that the plate surfaces thereof face the core 2.

In the housing 6, the busbar 1 corresponding to each current sensor A and the core 2 arranged around the busbar 1 are assembled together and these busbars 1 and cores 2 are integrally held.

The printed board 4 is integrally fixed to the housing 6 in the state of being arranged to face the housing 6. A circuit pattern corresponding to each current sensor A is printed on the printed board 4.

The Hall IC 3 has an element main body 3a held in the housing 6 and plural (in this embodiment, three) connection terminals 3b soldered and thus fixed to the corresponding circuit patterns through through-holes 4a in the printed board 4.

The element main body 3a is assembled at a center position in a direction of width of the gap 2a so as to be held in a positioned state, taking such an attitude that a detection surface thereof faces the core 2.

That is, in the housing 6, plural (in this embodiment, three) closed-bottom rectangular holding holes 6a, as holding portions in which the element main body 3a of the Hall IC 3 corresponding to each current sensor A can be fitted from the side of the printed board 4, are provided to open to the side of the printed board 4.

As the element main body 3a is fitted into each of these holding holes 6a, the element main body 3a is held at the center position in the direction of width of the gap 2a, with a degree of clearance that can allow thermal expansion of the element main body 3a due to heat generation by the electrification of the busbar 1.

Therefore, in the core 2, the magnetic flux generated according to the current flowing through the busbar 1 is concentrated. The concentrated magnetic flux passes over the gap 2a. Thus, a magnetic path is formed by the core 2 and the element main body 3a, and the Hall IC 3 can detect the strength of the magnetic field formed by the current to be measured flowing through the busbar 1.

In the Hall IC 3, three pin-shaped radial lead wires as the connection terminals 3b are provided in parallel on one lateral end surface along the direction of thickness of the element main body 3a.

Therefore, the Hall IC 3 is soldered to the printed board 4, with the connection terminals (radial lead wires) 3b inserted in each of the plural through-holes 4a formed in the printed board 4, instead of being mounted as surface-mount components.

In the terminal guide plate 5, plural (in this embodiment, nine) guide holes 5a in which the three connection terminals 3b of each Hall IC 3 having the element main body 3a held in the holding hole 6a are inserted separately from the side of the housing 6, are formed, penetrating the terminal guide plate 5.

Each guide hole 5a is formed penetrating the terminal guide plate 5, in a funnel-shape having a conical surface with the diameter thereof reduced from the side of the housing 6 toward the side of the printed board 4, and guides the connection terminal 3b of the element main body 3a held in each holding hole 6a in such a way that a distal end portion is inserted in the through-hole 4a in the printed board 4.

Of the three connection terminals 3b, adjacent connection terminals are bent at rising parts thereof from the element main body 3a into the opposite lateral directions to each other on both sides of the element main body 3a. Also, each of the distal end portions of the three connection terminals 3b bent in the lateral directions is further bent to follow a direction orthogonal to the plate surface of the printed board 4.

Therefore, the distal end portions of the adjacent connection terminals 3b can be prevented from being concentrated on a particular side of the element main body 3a, and the through-holes 4a for terminal insertion in the printed board 4 can be dispersed.

Thus, even if guide holes 5a with a maximum diameter are formed in the terminal guide plate 5 in order to enable the distal end portions of the connection terminals 3b to be securely guided into the through-holes 4a, the guide holes 5a can be arranged without interfering with each other.

The terminal guide plate 5 is provided with a columnar engagement pin 7a that is pushed into an engagement hole 7 that is formed penetrating the printed board 4.

As the engagement pint 7a is pushed into the engagement hole 7 from the side facing the housing 6, of the printed board 4, the terminal guide plate 5 is amounted on the side facing the housing 6, of the face and back sides of the printed board 4.

An engaging portion 8 and an engaged portion 8a for engaging and fixing the housing 6 and the printed board 4 in a positioned state are provided across the housing 6 and the printed board 4. The position of the engaging portion 8 and the engaged portion 8a is set at one position on an outer peripheral portion in the area where the plural element main bodies 3a are arranged.

The engaging portion 8 is formed as an engagement hole formed across the printed board 4 and the terminal guide plate 5. The engaged portion 8a is formed as a columnar engagement pin projected on the housing 6.

As the engagement pin (engaged portion) 8a is pushed into the engagement hole (engaging portion) 8 continued across the printed board 4 and the terminal guide plate 5, the printed board 4 and the terminal guide plate 5 are fixed to each other in the state where the printed board 4 and the terminal guide plate 5 are prevented from detaching from the housing 6 and in the state of being positioned in the housing 6.

A method for manufacturing the current sensor A (sensor unit U) will be described.

Figure 5:
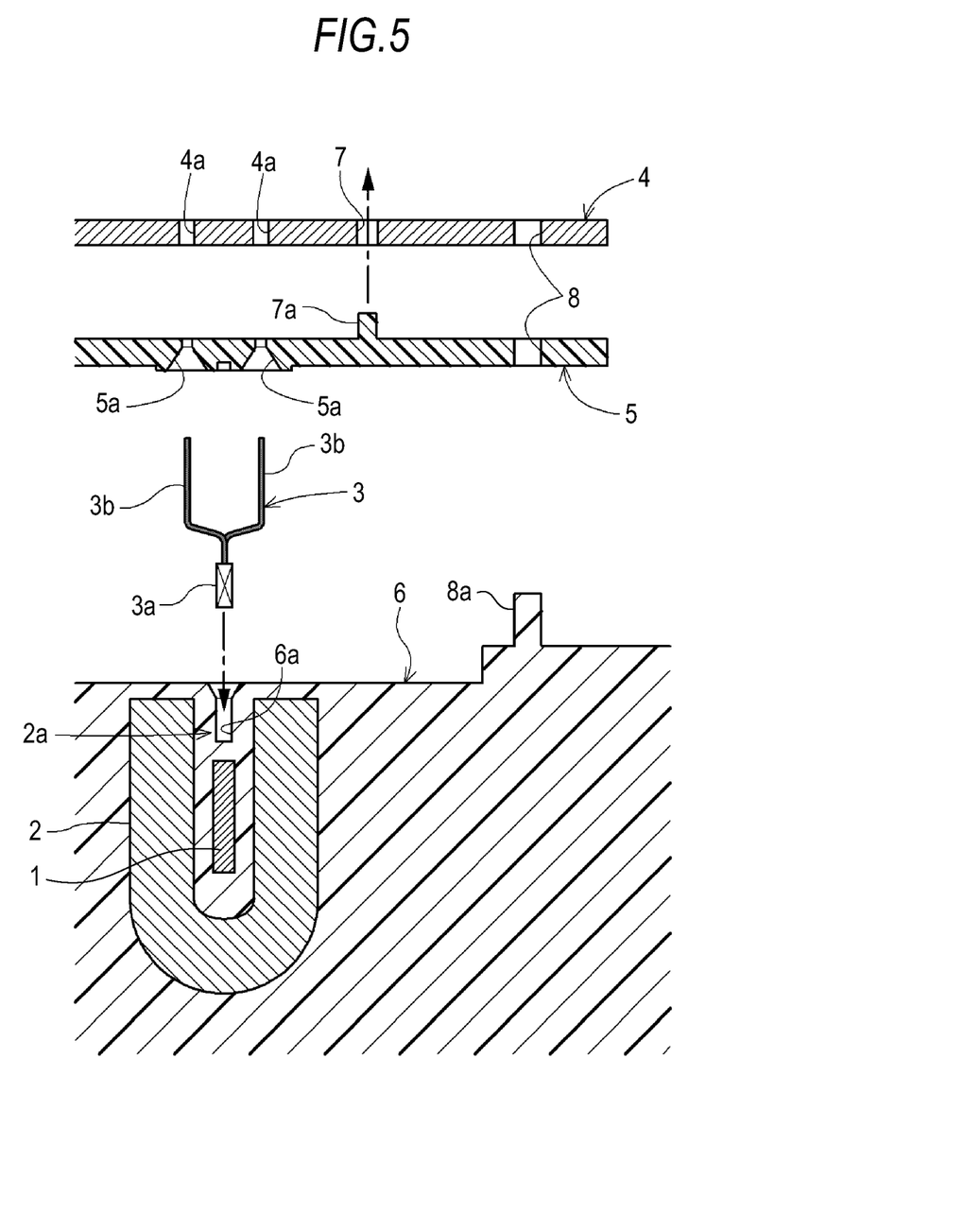
FIG. 5 is a cross-sectional view showing a process of assembling the current sensor.
Figure 6:
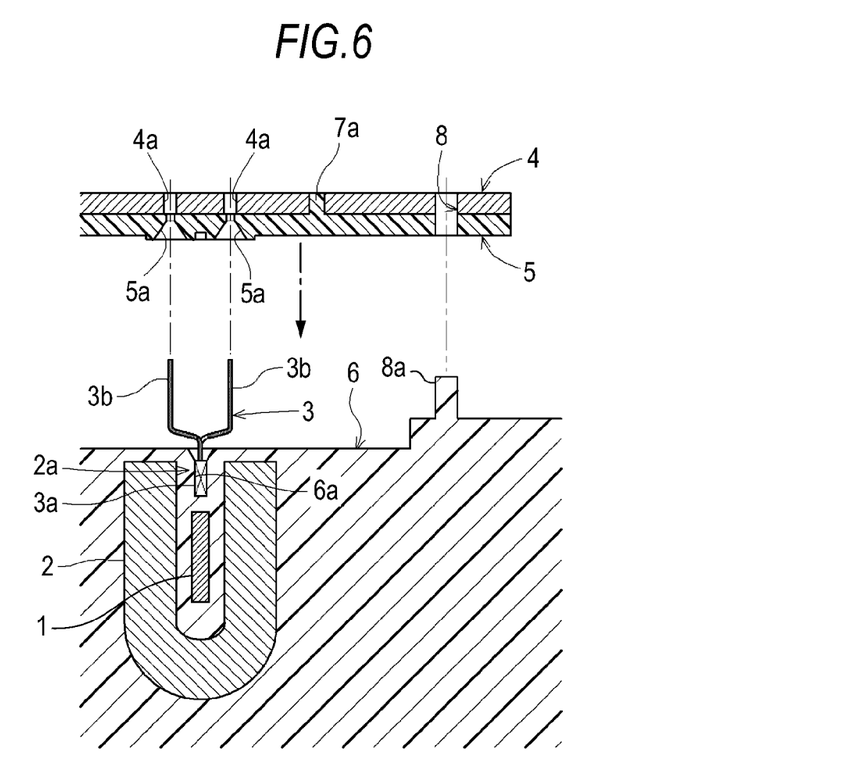
FIG. 6 is a cross-sectional view showing a process of assembling the current sensor.

In the method for manufacturing the current sensor A, the element main bodies 3a of the plural Hall ICs 3 corresponding to the respective current sensors A are held in advance in the holding holes 6a provided in the housing 6 holding the busbar 1 and the core 2, as shown in FIGS. 5 and 6 (element main body holding step).

The plural (in this embodiment, nine) connection terminals 3b extended from the element main bodies 3a held in the respective holding holes 6a in the element main body holding step are obliquely bent in advance toward the printed board 4 while spreading in separating directions from each other on both sides of the element main bodies 3a, and the end of each connection terminal 4b is bent to align the extending direction of the end with the direction heading perpendicularly from the housing 6 toward the printed board 4.

Next, as the engagement pin 7a is pushed into the engagement hole 7, the terminal guide plate 5 is mounted on the surface facing the housing 6, of the printed board 4 (guide plate mounting step).

Figure 7:
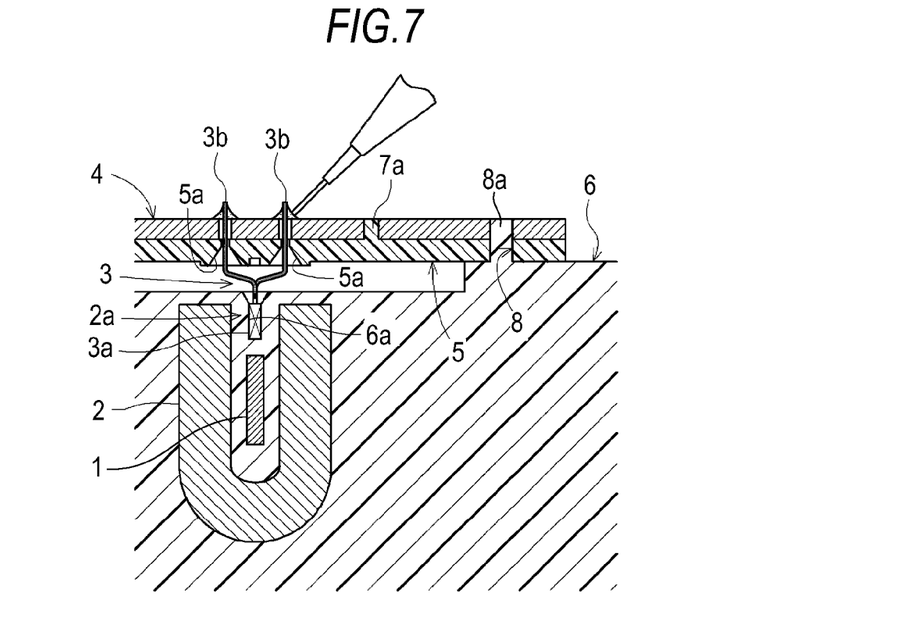
FIG. 7 is a cross-sectional view showing a process of assembling the current sensor.

As shown in FIGS. 6 and 7, the printed board 4 and the terminal guide plate 5 mounted on the printed board 4 are situated closely to the housing 6 holding the plural element main bodies 3a. While the engagement pin 8a is pushed into the engagement hole 8 to align the printed board 4 and the housing 6 together, each of the ends of the connection terminals 3b is inserted into the corresponding guide hole 5a in the terminal guide plate 5 and the corresponding through-hole 4a in the printed board 4.

Thus, the housing 6 and the printed board 4 are fixed to each other with the terminal guide plate 5 in the state where movement, with respect to the printed board 4, of the connection terminals 3b with the ends thereof inserted in the through-holes 4a is allowed (board fixing step).

Moreover, as shown in FIG. 7, each of the connection terminals 3b inserted in the through-holes 4a in the printed board 4 is soldered to the circuit pattern (soldering step).

Thus, each connection terminal 3b can be soldered to the printed board 4 in the state where there is little residual stress, and the assembling attitude of each element main body 3a to the core 2 (gap 2a) can be easily stabilized.

If the three guide holes 5a and through-holes 4a in which the three connection terminals 3b are inserted are formed adjacently to each other in a line, each connection terminal 3b may be bent toward the same side of the element main body 3a in such a way that the connection terminals 3b are spaced away from each other.

Second Embodiment

Figure 8:
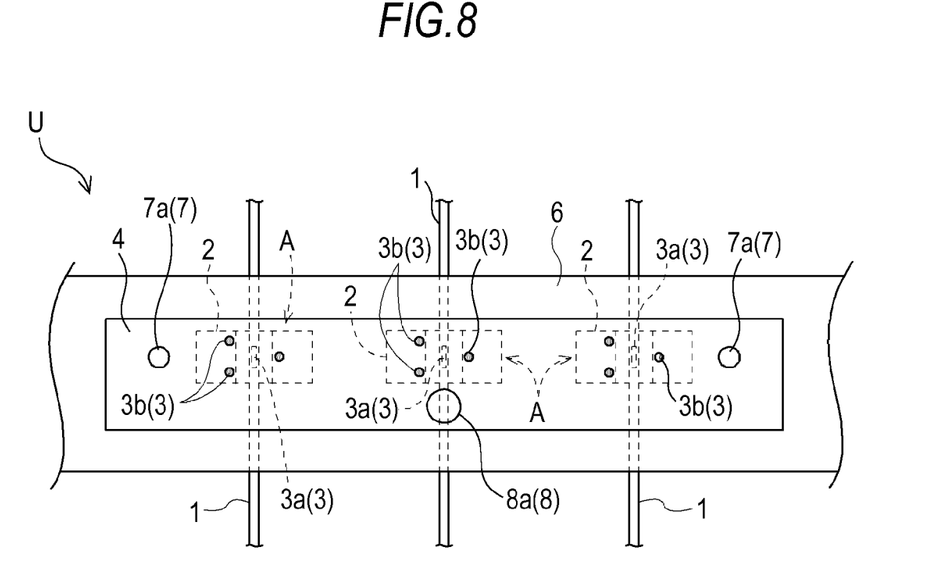
FIG. 8 is a plan view showing a sensor unit according to a second embodiment.

FIG. 8 shows a second embodiment disclosed here.

In this embodiment, the position of the engagement hole 8 forming the engaging portion and the engagement pin 8a forming the engaged portion, for fixing the printed board 4 and the housing 6 in the positioned state, is set substantially at a center part in the area where the plural element main bodies 3a are arranged.

According to this embodiment, a maximum length from the engagement hole 8 or the engagement pin 8a to the connection terminals 3b can be set to the shortest.

Therefore, even if the relative position between the printed board 4 and the housing 6 varies due to thermal deformation in use, the amount of deformation of the connection terminals 3b can be reduced and the shift of the element main body 3a due to the deformation of the connection terminals 3b can be restrained. Thus, high detection accuracy can be easily maintained over a long period.

The other parts of the configuration are similar to the first embodiment.

Third Embodiment

Figure 9:
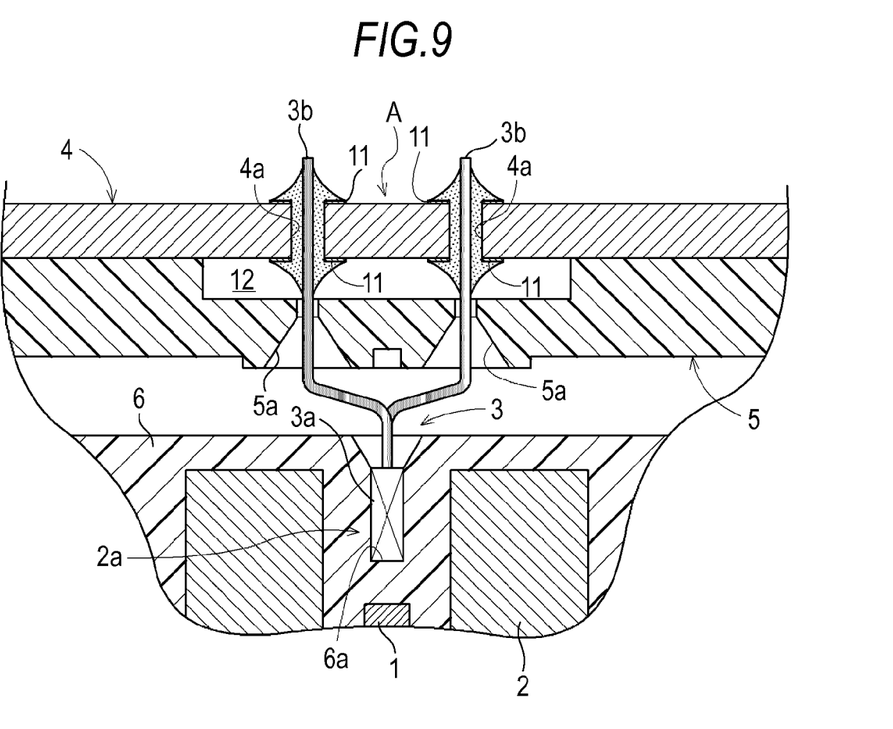
FIG. 9 is an enlarged view of a current sensor according to a third embodiment.

FIG. 9 shows a third embodiment disclosed here.

In this embodiment, a land 11 is formed around the through-holes 4a on the face side and back side of the printed board 4, and a recessed portion 12 is formed at a position facing the land 11 of the printed board 4, on the terminal guide plate 5. In this embodiment, the face side of the printed board 4 is the surface facing the side of the terminal guide plate 5, of the surfaces of the printed board 4. The back side of the printed board 4 is the surface facing the side opposite to the terminal guide plate 5, of the surfaces of the printed board 4. As in the foregoing embodiments, the through-holes 4a for fixing the connection terminals 3b are formed in the printed board 4 in this embodiment, too.

The expression "around the through-hole 4a" means an area surrounding the through-hole 4a at the center thereof, along the face side and back side of the printed board 4. As the connection terminals 3b are inserted in such through-holes 4a and a solder is deposited on the lands 11 on the back side of the printed board 4, a fillet is formed at each land 11 on the face side and back side of the printed board 4. Also, the solder enters the inside of the through-holes 4a. Thus, the solder fixing strength of the connection terminals 3b to the printed board 4 can be improved.

The position facing the land 11 of the printed board 4, on the terminal guide plate 5, is the position facing the land 11 on the face side of the printed board 4. At such a position on the terminal guide plate 5, the recessed portion 12 is formed. The opening width of the recessed portion 12 (equivalent to the length in the direction of board width of the printed board 4 and the length in the direction of board length) may be approximately the same as the land 11 facing this recessed portion 12. Of course, the opening width can be greater than the land 11 or can be smaller than the land 11. The depth of the recessed portion 12 (equivalent to the length in the direction of board thickness of the printed board 4) may be equal to or smaller than the height of the fillet formed in the land 11 facing the terminal guide plate 5. That is, it is preferable to form the recessed portion 12 with a predetermined depth and adjust the amount of solder when soldering the Hall IC 3.

The recessed portion 12 in this embodiment is formed to penetrate the terminal guide plate 5 along the direction of board width of the printed board 4. The direction of board width of the printed board 4 is the direction heading from the front toward the back of the sheet in FIG. 9. Penetrating the terminal guide plate 5 means the state where there is no wall part in the direction of board width. Therefore, when the recessed portion 12 is viewed from the front of the sheet, the sight in the back of the sheet can be seen. Thus, since the fillet formed at the land 11 on the side of the terminal guide plate 5 can be visually recognized through the recessed portion 12, whether soldering is being done properly or not can be confirmed by visual inspection or the like.

Other Embodiments

The current sensor A disclosed here may have the housing 6, the circuit board 4 and the terminal guide plate 5 for each current sensor A.

The current sensor A disclosed here can be used as a current sensor that measures a current flowing through various other busbars than a busbar connecting an electric motor to an inverter.

Figure 10:
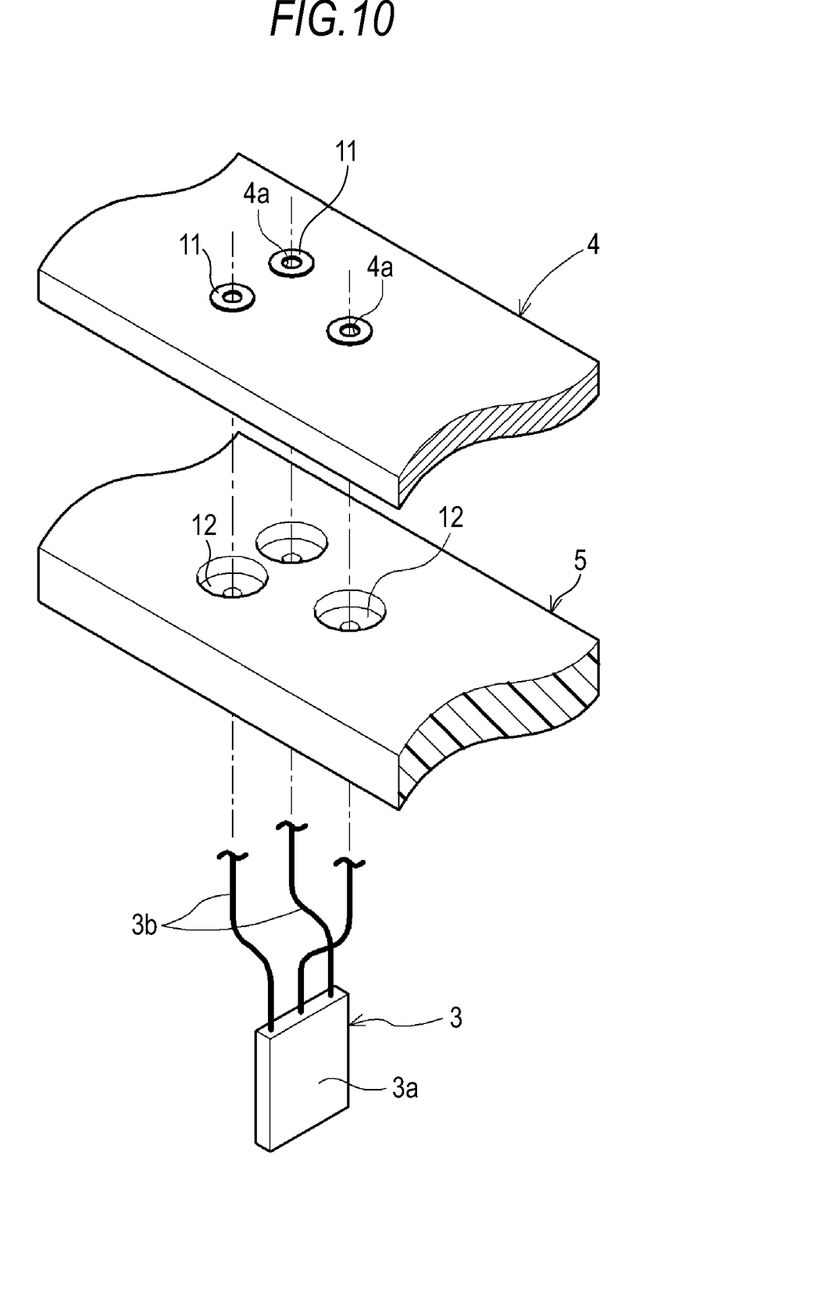
FIG. 10 shows a recessed portion according to another embodiment.
Figure 11:
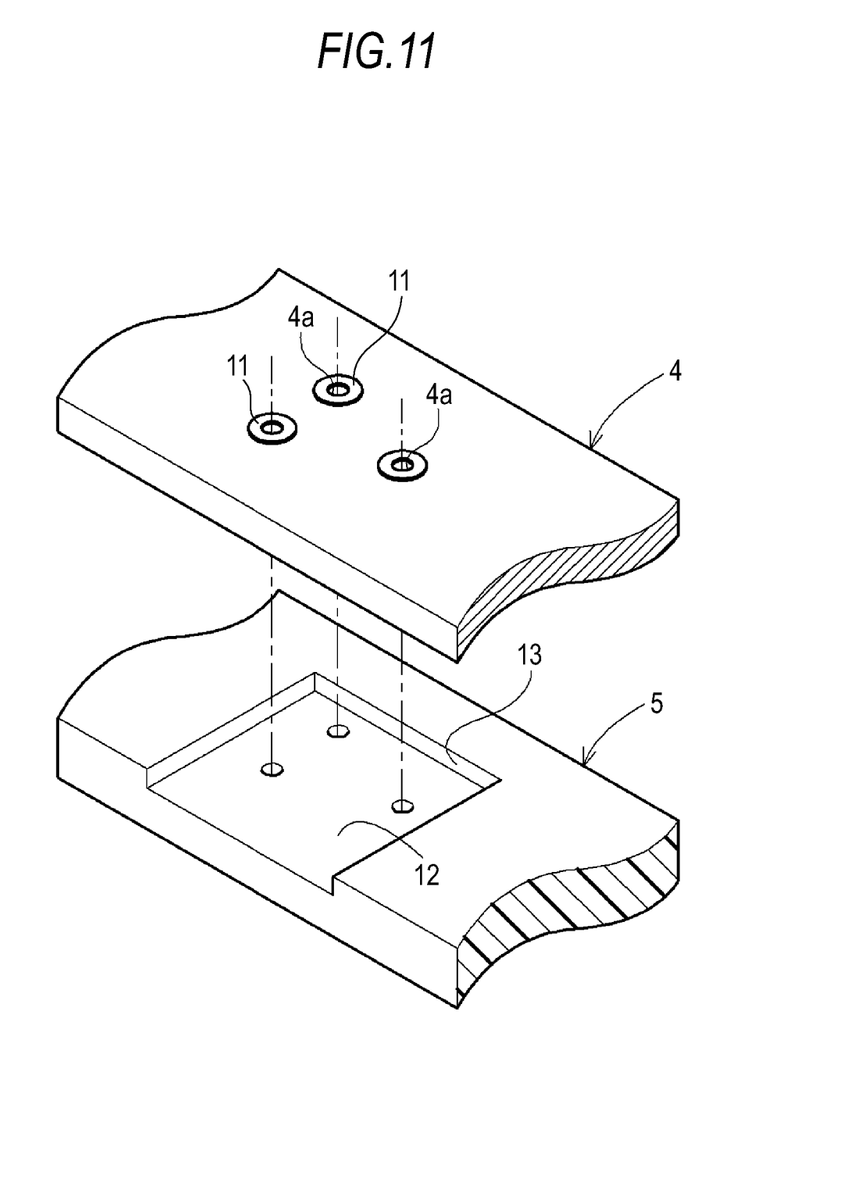
FIG. 11 shows a recessed portion according to another embodiment.

In the third embodiment, it is described that the recessed portion 12 is formed to penetrate the terminal guide plate 5 along the direction of board width of the printed board 4. However, as shown in FIG. 10, it is possible to form the recessed portion 12 only at a site faced by the land 11 on the side of the terminal guide plate 5. Even with such a configuration, the fillet can be formed at the lands 11 on the face side and back side of the printed board 4 and therefore the solder fixing strength can be improved. Moreover, as shown in FIG. 11, it is possible to form a wall portion 13 only on one side in the direction of board width of the printed board 4 so that the recessed portion 12 does not penetrate the terminal guide plate 5 along the direction of board width of the printed board 4.

The technique disclosed here can be used for a current sensor including: a housing that holds a busbar to which a current is applied and a core arranged around the busbar; a circuit board fixed to the housing in the state of being arranged to face the housing; and a detection element for detecting the current; wherein the detection element has an element main body held in the housing and plural connection terminals fixed in through-holes in the circuit board, and a manufacturing method for the same.

An aspect disclosed here is directed to a current sensor including: a housing that holds a busbar to which a current is applied and a core arranged around the busbar; a circuit board fixed to the housing in the state of being arranged to face the housing; and a detection element for detecting the current; wherein the detection element has an element main body held in the housing and plural connection terminals fixed in through-holes in the circuit board, and wherein a plate-like member provided with guide holes in which the connection terminals are inserted and which have a diameter reduced from the side of the housing toward the side of the circuit board is provided on a surface facing the housing, of two surfaces of the circuit board.

In the current sensor with this configuration, the plate-like member provided with the guide holes in which the connection terminals are inserted and which have a diameter reduced from the side of the housing toward the side of the circuit board is provided on the surface facing the housing, of the two surfaces of the circuit board.

Therefore, after the element main body is assembled at a predetermined position in the housing, each of the plural connection terminals can be inserted into each guide hole provided in the plate-like member, thus guiding the connection terminals to enter the through-holes in the circuit board.

Thus, the detection element can be easily assembled on both the circuit board and the housing, with each of the plural connection terminals securely entering each through-hole in the circuit board, while high assembling accuracy of the element main body to the core can be set in order to achieve high detection accuracy.

Moreover, as high assembling accuracy of the element main body to the core is set, the change in the attitude of the element main body to the core due to the difference in the coefficient of thermal expansion between the circuit board and the housing can be restrained.

Thus, according to the current sensor with this configuration, detection accuracy can be improved while the assembling of the detection element on both the circuit board and the housing is facilitated.

Another aspect disclosed here is directed to the current sensor described above, wherein the housing holds a plural number of the element main bodies, an engaging portion and an engaged portion that position the housing and the circuit board are provided separately on the housing and the circuit board, and the position of the engaging portion or the engaged portion is set at a central part in an area where the plural element main bodies are arranged.

Since the circuit board and the housing have different coefficient of thermal expansion from each other, the relative position between the circuit board and the housing can easily shift due to thermal deformation in use.

According to this configuration, the maximum length between the engaging portion or the engaged portion and the connection terminal can be substantially halved, compared with the case where the position of the engaging portion or the engaged portion that positions the housing and the circuit board is arranged at one position spaced away from the central part in the area where the plural element main bodies are arranged.

Therefore, high detection accuracy can be easily maintained over a long period.

It is preferable that lands are formed around the through-holes on a face side and a back side of the circuit board, and that a recessed portion is formed at a position facing the land of the circuit board, on the plate-like member.

According to such a configuration, a fillet can be formed on each land on the face side and the back side of the circuit board. Thus, since the solder fixing strength of the detection element can be increased, reliability of the soldering of the detection element can be improved.

The recessed portion may be formed to penetrate the plate-like member along a direction of board width of the circuit board.

According to such a configuration, the fillet formed on the connection terminal can be visually recognized via the recessed portion from the direction of board width of the circuit board. Therefore, any mounting error of the detection element can be easily found in visual inspection or the like. Thus, for example, even if there is a soldering error in the manufacturing process, the defect product can be easily extracted in visual inspection and therefore product quality can be improved.

Still another aspect disclosed here is directed to a method for manufacturing a current sensor including the steps of: causing a holding portion provided in a housing that holds a busbar to which a current is applied and a core arranged around the busbar, to hold element main bodies of plural detection elements for detecting the current in the state where that plural connection terminals extending from the element main bodies are bent so that adjacent connection terminals are spaced away from each other, and where an end of each connection terminal is bent to align an extending direction of the end with a direction toward a circuit board from the housing; mounting a plate-like member onto a surface facing the housing, of two surfaces of the circuit board fixed to the housing in the state of facing the housing, the plate-like member being provided with plural guide holes that have a diameter reduced from the side of the housing toward the side of the circuit board; situating the circuit board and the plate-like member closely to the housing holding the plural element main bodies, then inserting each of the ends of the connection terminals into the corresponding guide hole in the plate-like member and a corresponding through-hole in the circuit board while aligning the housing with the circuit board, and fixing the circuit board to the housing; and soldering the end of each of the connection terminals to the circuit board.

That is, as each holding portion provided in the housing that holds the busbar and the core holds the element main bodies of the plural detection elements, each element main body can be assembled to the core accurately.

As the circuit board and the plate-like member mounted on the surface of the circuit board facing the housing are situated closely to the housing, each of the ends of the connection terminals aligned in the direction toward the circuit board from the housing is inserted in the corresponding guide hole and the through-hole in the circuit board, while the housing and the circuit board are aligned together. Thus, the circuit board is fixed to the housing.

The respective connection terminals of the detection elements are bent in such a way that adjacent connection terminals are spaced away from each other, and the end of each connection terminal is bent toward the circuit board.

Therefore, even if large guide holes in which the connection terminals can be easily introduced are provided as guide holes in the plate-like member, these guide holes can be arranged without interfering with each other. Also, if the circuit board thermally expands and becomes displaced with respect to the housing, the connection terminals become deformed by bending and thus can absorb the displacement.

Also, the bending direction of the connection terminals is not the same direction but is set in directions away from each other. Therefore, when the circuit board is displaced in a particular direction with respect to the housing, even if a direction of the external force acting on each connection terminal is the same, the connection terminals bend in different directions from each other and therefore the connection terminals have different bending states from each other. Thus, no matter which direction the circuit board is displaced in, the influence of the external force applied to the element main bodies is averaged and the mounting stability of the element main bodies is increased.

Moreover, while each of the ends of the plural connection terminals can be easily inserted in the through-hole in the circuit board, the circuit board can be fixed to the housing in the state where the movement with respect to the circuit board, of the connection terminals with the ends thereof inserted in the through-holes is allowed.

As each of the ends of the connection terminals inserted in the through-hole in the circuit board is soldered to the circuit board after the circuit board is fixed to the housing, the detection element can be assembled on both the circuit board and the housing.

Thus, each connection terminal can be soldered to the circuit board in the state where there is little residual stress, and the assembling attitude of each element main body to the core can be easily stabilized.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A current sensor comprising:
    a housing that holds a busbar to which a current is applied and a core arranged around the busbar;
    a circuit board fixed to the housing in the state of being arranged to face the housing; and
    a plurality of detection elements for detecting the current; wherein each of the detection element has an element main body and a plurality of connection terminals, the element main body held in a holding hole of the housing and the plurality of connection terminals fixed in respective through-holes in the circuit board,
    a plate-like member provided on a surface of the circuit board facing the housing, the plate-like member provided with guide holes in which the plurality of connection terminals are respectively inserted, each of the guide holes has a diameter reduced from a side of the plate-like member closer to of the housing toward a side of the plate-like member closer to the circuit board, each of the plurality of connection terminals being respectively inserted into the through holes in the circuit board via the respective reduced-diameter guide holes in the plate-like member; and
    the plurality of connection terminals spreading in separating directions from each other on both sides of the element main body, an end of each connection terminal being bent to align the extending direction of the end with a direction heading perpendicularly from the housing toward the plate-like member.

2. The current sensor according to claim 1, wherein the housing holds a plural number of the element main bodies,
    an engaging portion and an engaged portion that position the housing and the circuit board are provided separately on the housing and the circuit board, and
    the position of the engaging portion or the engaged portion is set at a central part in an area where the plural element main bodies are arranged.

3. The current sensor according to claim 1, wherein lands are formed around the through-holes on a face side and a back side of the circuit board, and a recessed portion is formed at a position facing the land of the circuit board, on the plate-like member.

4. The current sensor according to claim 3, wherein the recessed portion is formed to penetrate the plate-like member along a direction of board width of the circuit board.

5. The current sensor according to claim 2, wherein lands are formed around the through-holes on a face side and a back side of the circuit board, and a recessed portion is formed at a position facing the land of the circuit board, on the plate-like member.

6. The current sensor according to claim 5, wherein the recessed portion is formed to penetrate the plate-like member along a direction of board width of the circuit board.

7. A method for manufacturing a current sensor comprising the steps of:
    causing a holding portion provided in a housing that holds a busbar to which a current is applied and a core arranged around the busbar, to hold element main bodies of plural detection elements for detecting the current in the state where plural connection terminals extending from the element main bodies are bent so that adjacent connection terminals spread in separating directions from each other on both sides of the element main body, and where an end of each connection terminal is bent to align an extending direction of the end with a direction toward a circuit board from the housing;
    mounting a plate-like member onto a surface the circuit board facing the housing, the plate-like member being provided with plural guide holes that have a diameter reduced from a side of the plate-like member closer to the housing toward a side of the plate-like member closer to the circuit board;
    situating the circuit board and the plate-like member closely to the housing holding the plural element main bodies, then inserting each of the ends of the connection terminals into the corresponding guide hole in the plate-like member and a corresponding through-hole in the circuit board while aligning the housing with the circuit board, and fixing the circuit board to the housing; and
    soldering the end of each of the connection terminals to the circuit board;
    wherein each of the plurality of connection terminals being respectively inserted into the through holes in the circuit board via the respective reduced-diameter guide holes in the plate-like member; and the end of each connection terminal is bent to align the extending direction of the end with a direction heading perpendicularly from the housing toward the plate-like member.

* * * * *